United States Patent
Lu et al.

(10) Patent No.: US 9,248,978 B2
(45) Date of Patent: Feb. 2, 2016

(54) POSITIONING DEVICE AND POSITIONING METHOD FOR POLARIZATION PLATE

(71) Applicant: Shenzhen China Star Optoelectronics Technology Co., Ltd., Shenzhen, Guangdong (CN)

(72) Inventors: Jiasheng Lu, Guangdong (CN); Desheng Yin, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 457 days.

(21) Appl. No.: 13/817,157

(22) PCT Filed: Dec. 27, 2012

(86) PCT No.: PCT/CN2012/087618
§ 371 (c)(1),
(2) Date: Feb. 15, 2013

(87) PCT Pub. No.: WO2014/094329
PCT Pub. Date: Jun. 26, 2014

(65) Prior Publication Data
US 2014/0294542 A1    Oct. 2, 2014

(30) Foreign Application Priority Data
Dec. 20, 2012  (CN) .......................... 2012 1 0555165

(51) Int. Cl.
*B65G 47/24* (2006.01)
*B65G 15/12* (2006.01)
*B65G 15/50* (2006.01)
*G02B 5/30* (2006.01)
*H01L 21/677* (2006.01)
*B65G 47/64* (2006.01)

(52) U.S. Cl.
CPC ................ *B65G 47/24* (2013.01); *B65G 15/12* (2013.01); *B65G 15/50* (2013.01); *G02B 5/3033* (2013.01); *H01L 21/677* (2013.01); *B65G 47/643* (2013.01)

(58) Field of Classification Search
CPC ...... B65G 15/10; B65G 15/105; B65G 15/12; B65G 15/50; B65G 47/24; B65G 47/244; B65G 47/643; H01L 21/677; G02B 5/3033
USPC ............................ 198/414, 861.1, 817, 345.1
See application file for complete search history.

(56) References Cited

U.S. PATENT DOCUMENTS

| | | | | |
|---|---|---|---|---|
| 3,955,665 A | * | 5/1976 | Pettis, Jr. ............... | G01G 15/00 177/145 |
| 4,456,116 A | * | 6/1984 | Jarman .................. | B65G 13/00 193/35 MD |
| 4,730,718 A | * | 3/1988 | Fazio ..................... | B65G 47/54 198/370.1 |

(Continued)

*Primary Examiner* — Leslie A Nicholson, III
*Assistant Examiner* — Keith R Campbell
(74) *Attorney, Agent, or Firm* — Sand & Sebolt

(57) ABSTRACT

A positioning device for a polarization plate is disposed adjacent to a transferring roller for receiving the polarization plate transferred from the transferring roller and further roughly positioning the polarization plate. The positioning device includes a positioning platform, a driving mechanism; and a conveying mechanism located under the positioning platform and connected to the driving mechanism. The conveying mechanism is capable of being driven to move upwards relative to the positioning platform by the driving mechanism to be partly exposed above the positioning platform. The positioning device ensures that the whole polarization plate can enter the positioning platform from the transferring roller and be transferred to the target position.

15 Claims, 4 Drawing Sheets

(56) References Cited

U.S. PATENT DOCUMENTS

| | | | |
|---|---|---|---|
| 5,293,984 A * | 3/1994 | Lucas | B65G 13/071 198/414 |
| 5,927,469 A * | 7/1999 | Dunifon | B32B 17/10954 198/345.1 |
| 6,601,689 B2 * | 8/2003 | Go | B23P 21/004 198/414 |

* cited by examiner

POSITIONING DEVICE AND POSITIONING METHOD FOR POLARIZATION PLATE

BACKGROUND

1. Technical Field

The present disclosure relates to technologies of liquid crystal panels, and particularly, to a positioning device for roughly positioning a polarization plate and a positioning method for roughly positioning the polarization plate using the positioning device.

2. Description of Related Art

In the manufacturing process of a liquid crystal panel, a polarization plate is generally bonded to a glass substrate with a printed circuit board arranged thereon. During the process of bonding the polarization plate to the glass substrate, the glass substrate and the polarization plate are positioned so that the polarization plate can be bonded to the glass substrate precisely.

At present, the polarization plate is generally transferred to a target position on a positioning platform of a positioning device by a transferring roller. After that, the position of the polarization plate is roughly adjusted by using positioning posts arranged on the positioning platform, which allows the polarization plate to be located at a roughly-adjusting position on the positioning platform and further ensures that the position of the polarization plate can be precisely adjusted by using CCD image sensor(s). In this way, the polarization plate can be positioned in the following processes of transferring the polarization plate, stripping the polarization plate, and tearing the releasable film layer. However, being affected by the surface of the positioning platform, the thickness of the polarization plate, and the surface of the polarization plate, a special transferring roller generally cannot transfer all types of polarization plates to the target positions precisely, which prevents the positioning posts from moving the polarization plate to the rough-adjusting position, prevents the CCD image sensor(s) from precisely adjusting the position of the polarization plate in a following precise adjusting process, and thus reduces the productivity of the liquid crystal panel.

SUMMARY

The present disclosure provides a positioning device for a polarization plate, which can roughly position the polarization plate transferred from a transferring roller such that the position of the polarization plate can be precisely adjusted in the following process.

The positioning device for a polarization plate is disposed adjacent to a transferring roller for receiving the polarization plate transferred from the transferring roller and further roughly positioning the polarization plate, including:

a positioning platform;

a driving mechanism; and a conveying mechanism located under the positioning platform and connected to the driving mechanism, the conveying mechanism capable of being driven to move upwards relative to the positioning platform by the driving mechanism to be partly exposed above the positioning platform.

Preferably, the positioning platform forms an opening corresponding to the conveying mechanism, and the conveying mechanism moves upwards to be partly exposed above the positioning platform through the opening.

Preferably, the positioning device further includes a first sensor for detecting whether the polarization plate enters the positioning platform or not and outputting a first detecting signal to the driving mechanism after determining that the polarization plate enters the positioning platform, and the driving mechanism drives the conveying mechanism to move upwards according to the first detecting signal.

Preferably, the first sensor is fixed to the positioning platform and corresponds to the opening formed in the positioning platform.

Preferably, the conveying mechanism includes spaced roller groups and a belt surrounding the roller groups, and the belt is capable of moving upwards to be exposed above the positioning platform.

Preferably, the positioning device further includes a second sensor arranged at a position on the positioning platform adjacent to the transferring roller, the second sensor is configured for detecting whether the polarization plate is transferred to a target position on the positioning platform or not and outputting a second detecting signal to the driving mechanism after determining that the polarization plate is transferred to the target position, and the driving mechanism drives the conveying mechanism to move downwards to be located under the positioning platform according to the second detecting signal.

Preferably, the roller groups include a first roller group adjacent to the transferring roller and a second roller group opposite to the first roller group, and the second sensor is located between the transferring roller and the first roller group.

Preferably, the positioning device further includes a positioning assembly arranged on the positioning platform for moving the polarization plate at the target position to a rough adjustment position.

Preferably, the positioning assembly includes a first positioning post and a second positioning post, the first positioning post is arranged on one end of the positioning platform away from the transferring roller, and the second positioning post is arranged on one end of the positioning platform adjacent to the transferring roller and is capable of moving towards the first positioning post.

The present disclosure further provides a positioning method for roughly positioning a polarization plate using the positioning device, including:

detecting whether the polarization plate enters the positioning platform or not, if the polarization plate enters the positioning platform, moving the conveying mechanism upwards until the conveying mechanism is partly exposed above the positioning platform, otherwise returning to the step of detecting whether the polarization plate enters the positioning platform or not;

turning on the conveying mechanism such that the conveying mechanism can transfer the polarization plate; and detecting whether the polarization plate is transferred to a target position on the positioning platform or not, if the polarization plate is transferred to the target position, moving the conveying mechanism downwards until the conveying mechanism is located under the positioning platform, otherwise returning to the step of detecting whether the polarization plate is transferred to the target position or not.

The present disclosure further provides another positioning device for a polarization plate disposed adjacent to a transferring roller for receiving the polarization plate transferred from the positioning device and further for roughly positioning the polarization plate, including:

a positioning platform forming an opening;

a conveying mechanism arranged under the positioning platform and corresponding to the opening, the conveying mechanism including roller groups and a belt surrounding the roller groups;

a first sensor for detecting whether the polarization plate enters the positioning platform or not and outputting a first detecting signal after determining that the polarization plate enters the positioning platform; and a driving mechanism connected to the conveying mechanism and the first sensor, the driving mechanism driving the conveying mechanism to move upwards through the opening to allow the belt to be exposed above the positioning platform after receiving the first detecting signal.

Preferably, the first sensor is fixed to the positioning platform and corresponds to the opening formed in the positioning platform.

Preferably, the positioning device further includes a second sensor arranged at a position on the positioning platform adjacent to the transferring roller, the second sensor is used for detecting whether the polarization plate is transferred to a target position on the positioning platform or not and outputting a second detecting signal to the driving mechanism after determining that the polarization plate is transferred to the target position, and the driving mechanism drives the conveying mechanism to move downwards to be located under the positioning platform according to the second detecting signal.

Preferably, the roller groups includes a first roller group adjacent to the transferring roller and a second roller group opposite to the first roller group, and the second sensor is located between the transferring roller and the first roller group.

Preferably, the positioning device further includes a positioning assembly arranged on the positioning platform for moving the polarization plate at the target position to a rough-adjusting position.

Preferably, the positioning assembly includes a first positioning post and a second positioning post, the first positioning post is arranged on one end of the positioning platform away from the transferring roller, and the second positioning post is arranged on one end of the positioning platform adjacent to the transferring roller and is capable of moving towards the first positioning post.

In the positioning device of the present disclosure, the conveying mechanism is arranged under the positioning platform and is capable of moving upwards relative to the positioning platform to the belt being exposed above the positioning platform, thus, the conveying mechanism can contact the part of the polarization plate transferred out of the transferring roller. In this way, the polarization plate can be transferred under the friction between the belt and the polarization plate, which ensures that the whole polarization plate can enter the positioning platform from the transferring roller and be transferred to the target position. Therefore, the situation that the polarization plate cannot be transferred out of the transferring roller completely, or the situation that the polarization plate moves too fast on the positioning platform and thus hits the positioning assembly and rebounds due to small friction between the polarization plate and the positioning platform can be avoided.

DESCRIPTION OF THE DRAWINGS

Many aspects of the embodiments can be better understood with reference to the following drawings. The components in the drawings are not necessarily dawns to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment is this disclosure are not necessarily to the same embodiment, and such references mean at least one.

Figure 1:
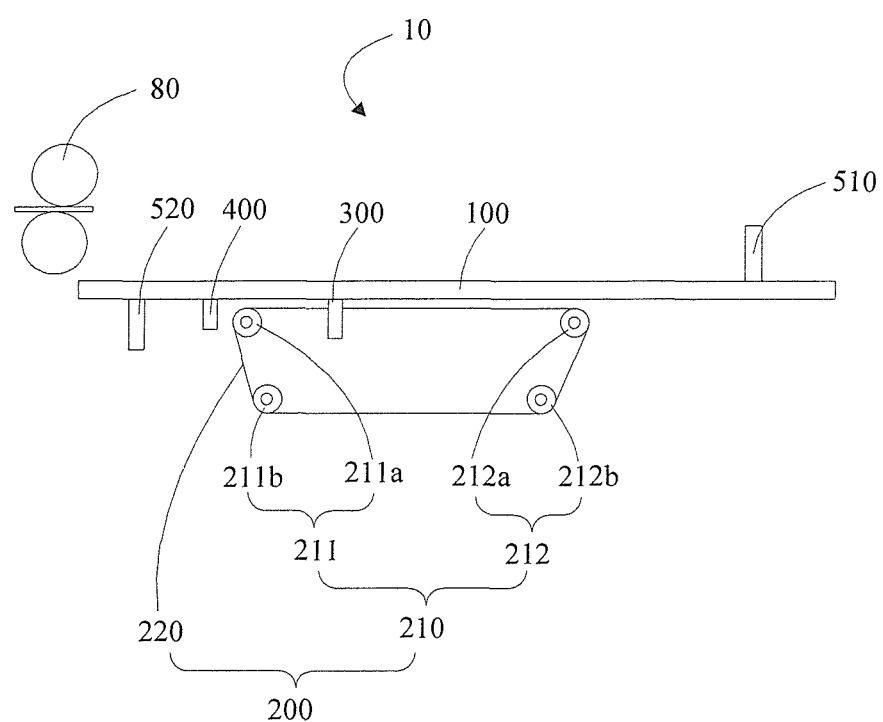
FIG. 1 is a schematic view of a positioning device in accordance with an embodiment of the present disclosure, with a conveying mechanism of the positioning device being located under a positioning platform of the positioning device.

Referring to FIG. 1, which is a schematic view of a positioning device in accordance with an embodiment of the present disclosure. The positioning device 10 is disposed adjacent to a transferring roller 80 for receiving a polarization plate transferred from the transferring roller 80 and roughly positioning the polarization plate, thus, the polarization plate can be precisely positioned in following positioning processes by using CCD image sensor(s) and further be bonded to a glass substrate precisely. In the embodiment, the positioning device 10 includes a positioning platform 100, a conveying mechanism 200, a driving mechanism (not shown), a first sensor 300, a second sensor 400, and a positioning assembly.

The positioning platform 100 is adjacent to the transferring roller 80 for receiving the polarization plate transferred from the transferring roller and supporting the polarization plate. As shown in FIG. 1, in the embodiment, a top surface of the positioning platform 100 is slightly lower than the transferring roller 80. Thus, since the polarization plate is a soft plate, an end of the polarization plate transferred out of the transferring roller 80 can hang down to contact the top surface of the positioning platform 100 and further enter the positioning platform 100. In the embodiment, an opening (not shown) is formed in the positioning platform 100.

The conveying mechanism 200 is arranged under the positioning platform 100 and corresponds to the opening formed in the positioning platform 100. The conveying mechanism 200 is connected to the driving mechanism. The conveying mechanism 200 can be driven by the driving mechanism to move upwards relative to the positioning platform 100 to be partly exposed above the top surface of the positioning platform 100. In the embodiment, the conveying mechanism 200 includes roller groups 210 and a belt 220 surrounding the roller groups 210. The roller groups 210 include a first roller group 211 and a second roller group 212. The first roller group 211 is adjacent to the transferring roller 80, and includes a first roller 211a and a second roller 211b spaced apart from the first roller 211a. The second roller group 212 is away from the transferring roller 80 and is opposite to the first roller group 211. The second roller group 212 includes a third roller 212a and a fourth roller 212b spaced apart from the third roller 212a. The height of the first roller group 211 is equal to that of the second roller group 212, which allows the surface of the belt 220 to be parallel to the top surface of the positioning platform 100. In the embodiment, the first roller group 210 and the second roller group 220 respectively include two top-to-bottom spaced rollers which can be tightening rollers. It is understood that the number of the rollers of each roller group is not limited to the embodiment. In the other embodiments, each roller group can only include one roller or include more than two rollers.

The first sensor 300 is fixed to the positioning platform 100, corresponds to the opening formed in the positioning platform 100, and is connected to the driving mechanism. The first sensor 300 is configured for detecting whether the polarization plate enters the positioning platform 100 or not. The first sensor 300 outputs a first detecting signal to the driving mechanism after determining that the polarization plate enters the positioning platform 100, thus, the driving mechanism can operate according to the first detecting signal to drive the conveying mechanism to move upwards. In the embodiment, the first sensor can include a pair of photoelectric tubes. The polarization plate corresponds to the first sensor 300 and covers the first sensor 300 after entering the positioning plate. An emitting tube of the first sensor 300 emits a signal. The signal then is received by a receiving tube of the first sensor 300 after being reflected from the polarization plate. The receiving tube receives the reflected signal and outputs the first detecting signal indicating that the polarization plate enters the positioning platform 100. It is noted that the first detecting signal can be an infrared signal, a high-level signal, or a low-level signal.

The second sensor 400 is arranged at a position on the positioning platform 100 adjacent to the first roller group 211 and is located between the transferring roller 80 and the first sensor 300. The second sensor 400 is connected to the driving mechanism for detecting whether the polarization plate is transferred to a target position on the positioning platform 100 or not. The second sensor 400 outputs a second detecting signal to the driving mechanism after determining that the polarization plate is transferred to the target position such that driving mechanism can operate according to the second detecting signal and drive the conveying mechanism 200 to move downwards to be located under the positioning platform 100. In the embodiment, the second sensor 400 can be a photo sensor. After the polarization plate enters the polarization plate after separating from the transferring roller 80, the polarization plate corresponds to the second sensor 400 and covers the second sensor 400. As the polarization plate moves on the positioning platform, the second sensor 400 passes through the second sensor 400. The second sensor 400 no longer covers the second sensor 400 when the polarization plate is at the target position. In this way, the second sensor 400 can detect whether the polarization plate is transferred to the target position or not according to the difference of the intensity of the light sensed thereby.

The positioning assembly is arranged on the positioning platform 100 for moving the polarization plate on the target position to a rough-adjusting position. In the embodiment, the positioning assembly includes a first positioning post 510 and a second positioning post 520. The first positioning post 510 is fixed to one end of the positioning platform 100 which is away from the transferring roller 80 and extends upwards form the top surface of the positioning platform 100. The second positioning post 520 is arranged on the bottom surface of one end of the positioning platform 100 adjacent to the transferring roller 80. Meanwhile, the second positioning post 520 is capable of moving upwards/downwards relative to the positioning platform 100 and is capable of moving towards or moving away from the first positioning post 510, thereby moving the polarization plate on the target position to the rough-adjusting position. In the embodiment, the rough-adjusting position can be determined according to the position of the first positioning post 510 and the size of the polarization plate. When the polarization plate moves to a position at which one end of the polarization plate away from the transferring roller abuts the first positioning post 510, it can determine that the polarization plate is moved to the rough-adjusting position.

Figure 2:
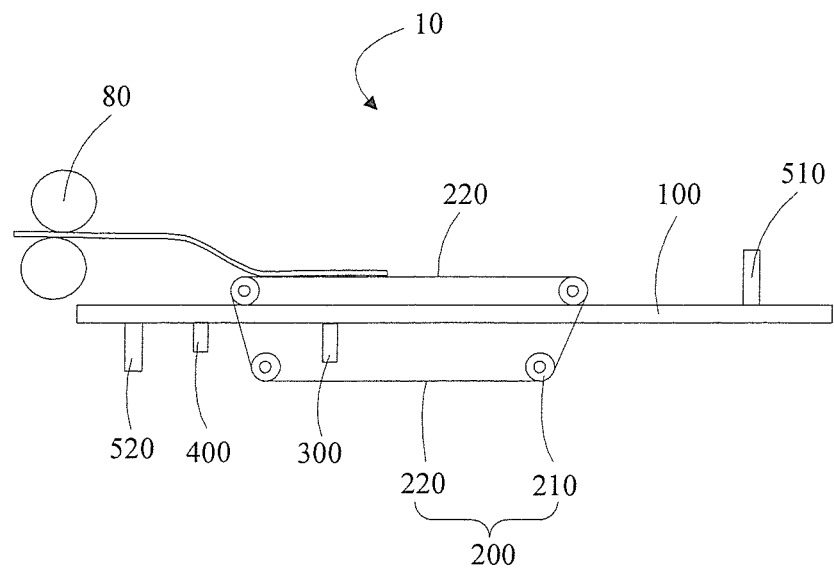
FIG. 2 is similar to FIG. 1, with the conveying mechanism moving upwards to be located above the positioning platform.
Figure 3:
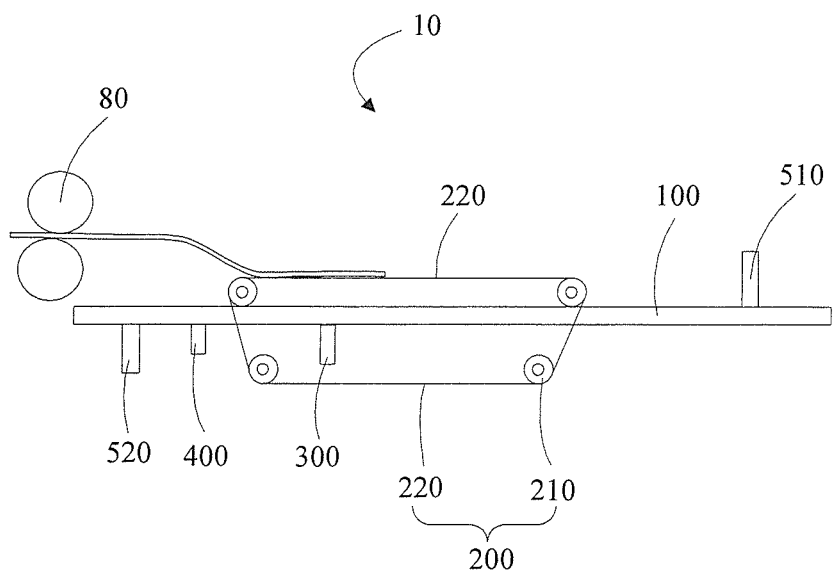
FIG. 3 is similar to FIG. 1, with the conveying mechanism being at an operating state.

As shown in FIG. 1, after the polarization plate enters the transferring roller 80, the polarization plate is transferred towards the positioning platform 100 by the transferring roller 80. On end of the polarization plate adjacent to the positioning device 10 contacts the top surface of the positioning platform 100 after being transferred out of the transferring roller 80 and corresponds to the first sensor 300. Since in the embodiment, the first sensor 300 includes a pair of photoelectrical tubes, therefore, the first sensor 300 outputs the first detecting signal to the driving mechanism after the polarization plate corresponds to the first sensor 300. The driving mechanism 300 receives the first detecting signal and in response drives the conveying mechanism 200 to move upwards relative to the positioning platform 100. As shown in FIG. 2, after the conveying mechanism 200 moves upwards to be partly located above the positioning platform 100, the belt 220 is exposed above the positioning platform 100 and abuts one end of the polarization plate contacting the positioning platform 100. After the conveying mechanism 200 is turned on, the roller groups 210 begin to rotate, thereby driving the belt 220 to move. At this time, under the friction between the belt 220 and the polarization plate, the end of the polarization plate covering the belt 220 moves away from transferring roller 80 as the belt 220 rotates, thereby separating the whole polarization plate from the transferring roller 80 and allowing the polarization plate to be transferred onto the positioning platform 100 completely, as shown in FIG. 3. At this time, the whole polarization plate covers the conveying mechanism 200 and two ends thereof cover the top surface of the positioning platform 100.

Figure 4:
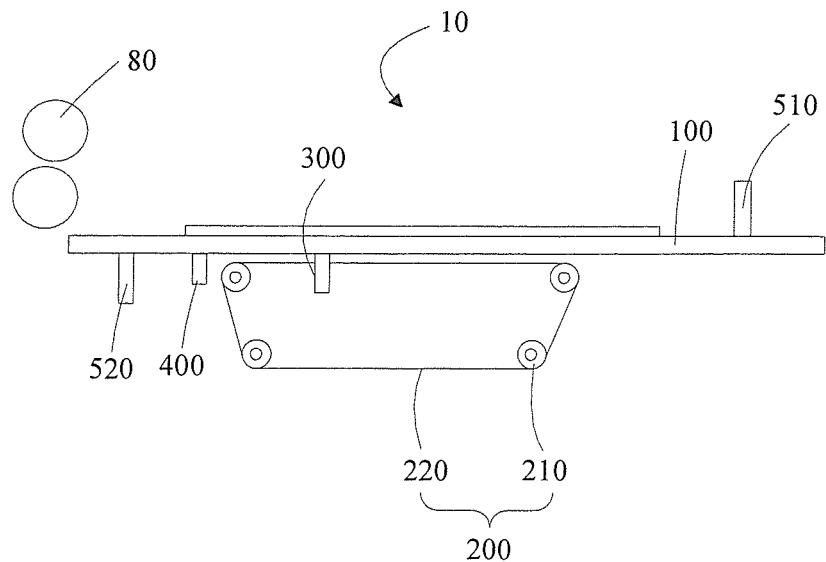
FIG. 4 is similar to FIG. 1, with the conveying mechanism moving downwards to be located under the positioning platform.

As the belt 220 rotates, the polarization plate moves towards the target position relative to the positioning platform 100. During the process, the polarization plate moves from a position corresponding to the second sensor 400 to the target position no longer corresponding to the second sensor 400. Since in the embodiment, the second sensor is a photo sensor, therefore, after the polarization plate moves to the target position which does not correspond to the second sensor 400, the second sensor 400 outputs the second detecting signal to the driving mechanism according to the intensity difference of the light detected thereby. The driving mechanism receives the second detecting signal, and in response turns off the conveying mechanism 200 and drives the conveying mechanism 200 to move downwards relative to the positioning platform 100 to be located under the positioning platform 100, as shown in FIG. 4.

Figure 5:
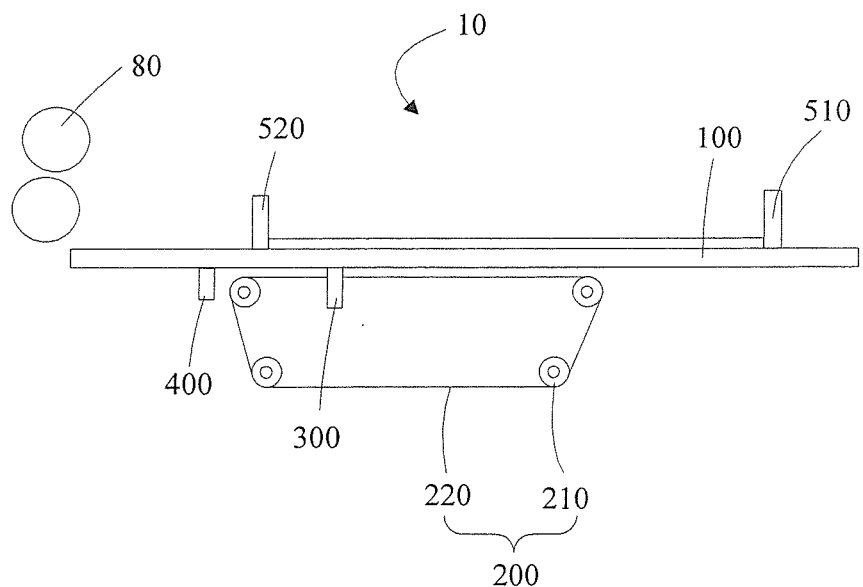
FIG. 5 is similar to FIG. 1, with a polarization plate being located at a rough-adjusting position under the positioning device.

At this time, the second positioning post 520 of the positioning assembly moves upwards relative to the positioning platform 100 to be exposed above the top surface of the positioning platform 100 and abut one end of the polarization plate adjacent to the transferring roller 80. After that, the second positioning post 520 moves towards the first positioning post 510, thereby driving the polarization plate to move towards the first positioning post 510 until the end of the polarization plate away from the transferring roller abuts the first positioning post 510, as shown in FIG. 5. At this time, the polarization plate is located on the rough-adjusting position, which ensures that the position of the polarization plate can be precisely adjusted by using CCD image sensor(s) in the following process.

In the positioning device 10 of the present disclosure, the conveying mechanism is arranged under the positioning platform 100 and is capable of moving upwards relative to the positioning platform 100 to the belt 220 being exposed above the positioning platform 100, thus, the conveying mechanism 200 can contact the part of the polarization plate transferred out of the transferring roller 80. In this way, the polarization plate can be transferred under the friction between the belt 220 and the polarization plate, which ensures that the whole polarization plate can enter the positioning platform 100 from the transferring roller 80 and be transferred to the target position. Therefore, the situation that the polarization plate cannot be transferred out of the transferring roller 80 completely, or the situation that the polarization plate moves too fast on the positioning platform 100 and thus hits the positioning assembly and rebounds due to small friction between the polarization plate and the positioning platform 100 can be avoided.

Figure 6:
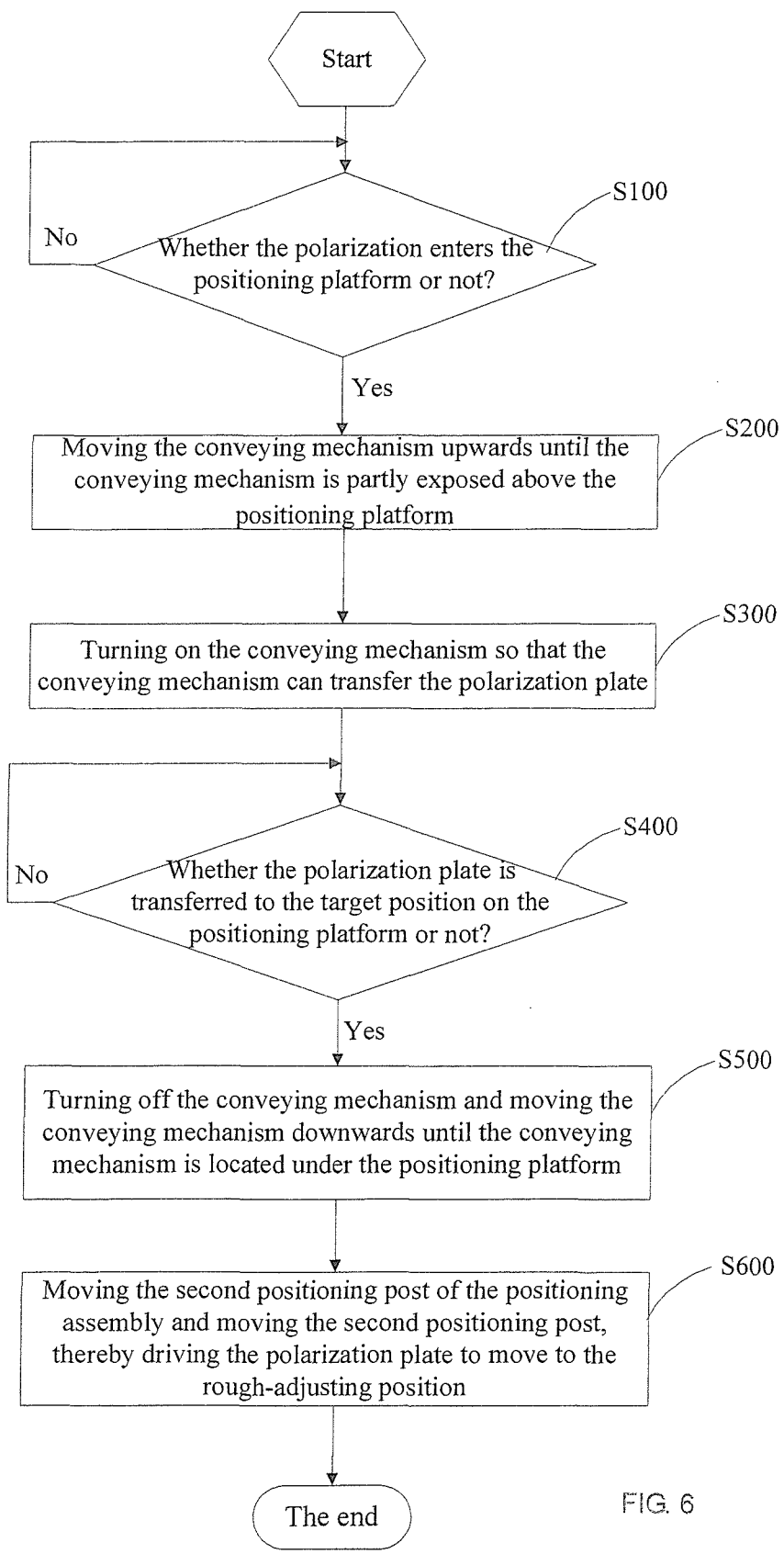
FIG. 6 is a flow chart of a positioning method for roughly positioning the polarization plate by using the positioning device shown from FIGS. 1 to 5.

The present disclosure further provides a positioning method for roughly positioning the polarization plate using the above positioning device 10. As shown in FIG. 6, the positioning method includes the following steps.

Step S100, detecting whether the polarization plate enters the positioning platform or not, if the polarization plate enters the positioning platform, performing step S200, otherwise returning to the step S100. In the embodiment, the first sensor 300 is used for detecting whether the polarization plate enters the positioning platform or not. The first sensor 300 is arranged on the conveying mechanism, corresponds to the opening formed in the positioning platform, and is connected to the driving mechanism. The first sensor 300 outputs the first detecting signal after the determining that the polarization plate enters the positioning platform 100 such that the driving mechanism can operate according to the first detecting signal and drive the conveying mechanism 200 to move upwards.

Step S200, moving the conveying mechanism upwards until the conveying mechanism is partly exposed above the positioning platform. In the embodiment, after receiving the first detecting signal from the first sensor 300, the driving mechanism drives the conveying mechanism 200 to move upwards to allow the belt 220 to be exposed above the positioning platform 100, thus, the belt 220 can contact one end of the polarization plate transferred out of the transferring roller.

Step S300, turning on the conveying mechanism so that the conveying mechanism can transfer the polarization plate. In the embodiment, after the conveying mechanism is turned on, the roller groups 210 begin to rotate, thereby driving the belt 220 to move together. At this time, under the friction between the belt 220 and the polarization plate, one end of the polarization plate contacting the belt 220 moves away from the transferring roller 80 as the belt 220 rotates, which drives the whole polarization plate to be transferred onto the positioning platform 100 out of the transferring roller 80.

Step S400, detecting whether the polarization plate is transferred to the target position on the positioning platform or not, if the polarization plate is transferred to the target position, performing step S500, otherwise returning to the step S400. In the embodiment, the second sensor 400 is used for detecting whether the polarization plate is transferred to the target position on the positioning platform 100. The second sensor 400 is arranged at a position on the positioning platform 100 adjacent to the first roller group 211 and is connected to the driving mechanism. The second sensor 400 outputs the second detecting signal to the driving mechanism after determining that the polarization plate is transferred to the target position. In this way, the driving mechanism can operate according to the second detecting signal to drive the conveying mechanism 200 to move downwards to be located under the positioning platform 100.

Step S500, turning off the conveying mechanism and moving the conveying mechanism downwards until the conveying mechanism is located under the positioning platform.

Step S600, moving the second positioning post of the positioning assembly and moving the second positioning post, thereby driving the polarization plate to move to the rough-adjusting position. In the embodiment, the second positioning post abuts the polarization plate when moving towards the first positioning post 510 and thus drives the polarization plate to move towards the first positioning post 510 together until the end of the polarization plate away from the transferring roller 80 abuts the first positioning post 510. At this time, the polarization plate is on the rough-adjusting position, which ensures that the position of the polarization plate can be precisely adjusted by using CCD image sensor in the following precise adjusting process.

In the positioning method for roughly positioning the polarization plate of the present disclosure, the conveying mechanism is arranged under the positioning platform and is capable of moving upwards relative to the positioning platform until the belt is exposed above the positioning platform, thus, the conveying mechanism can contact the part of the polarization plate transferred out of the transferring roller. In this way, the polarization plate can be transferred under the friction between the belt and the polarization plate, which ensures that the whole polarization plate can enter the positioning platform from the transferring roller and be transferred to the target position. Therefore, the situation that the polarization plate cannot be transferred out of the transferring roller completely, or the situation that the polarization plate moves too fast on the positioning platform and hits the positioning assembly and thus rebounds due to small friction between the polarization plate and the positioning platform can be avoided.

Even though information and the advantages of the present embodiments have been set forth in the foregoing description, together with details of the mechanisms and functions of the present embodiments, the disclosure is illustrative only; and that changes may be made in detail, especially in matters of shape, size, and arrangement of parts within the principles of the present embodiments to the full extend indicated by the broad general meaning of the terms in which the appended claims are expressed.

What is claimed is:

1. A positioning device for a polarization plate disposed adjacent to a transferring roller for receiving the polarization plate transferred from the transferring roller and further roughly positioning the polarization plate, comprising: a positioning platform; a driving mechanism; and a conveying mechanism located under the positioning platform and connected to the driving mechanism, the conveying mechanism capable of being driven to move upwards relative to the positioning platform by the driving mechanism to be partly exposed above the positioning platform;

further comprising a first sensor for detecting whether the polarization plate enters the positioning platform or not and outputting a first detecting signal to the driving mechanism after determining that the polarization plate enters the positioning platform, and the driving mechanism drives the conveying mechanism to move upwards according to the first detecting signal.

2. The positioning device as claimed in claim 1, wherein the positioning platform forms an opening corresponding to the conveying mechanism, and the conveying mechanism moves upwards to be partly exposed above the positioning platform through the opening.

3. The positioning device as claimed in claim 1, wherein the first sensor is fixed to the positioning platform and corresponds to the opening formed in the positioning platform.

4. The positioning device as claimed in claim 2, wherein the conveying mechanism comprises spaced roller groups and a belt surrounding the roller groups, and the belt is capable of moving upwards to be exposed above the positioning platform.

5. The positioning device as claimed in claim 2 further comprising a second sensor arranged at a position on the positioning platform adjacent to the transferring roller, the second sensor is configured for detecting whether the polarization plate is transferred to a target position on the positioning platform or not and outputting a second detecting signal to the driving mechanism after determining that the polarization plate is transferred to the target position, and the driving mechanism drives the conveying mechanism to move downwards to be located under the positioning platform according to the second detecting signal.

6. The positioning device as claimed in claim 5, wherein the roller groups comprise a first roller group adjacent to the transferring roller and a second roller group opposite to the first roller group, and the second sensor is located between the transferring roller and the first roller group.

7. The positioning device as claimed in claim 5 further comprising a positioning assembly arranged on the positioning platform for moving the polarization plate at the target position to a rough adjustment position.

8. The positioning device as claimed in claim 7, wherein the positioning assembly comprises a first positioning post and a second positioning post, the first positioning post is arranged on one end of the positioning platform away from the transferring roller, and the second positioning post is arranged on one end of the positioning platform adjacent to the transferring roller and is capable of moving towards the first positioning post.

9. A positioning method for roughly positioning a polarization plate using the positioning device in claim 1, comprising: detecting whether the polarization plate enters the positioning platform or not, if the polarization plate enters the positioning platform, moving the conveying mechanism upwards until the conveying mechanism is partly exposed above the positioning platform, otherwise returning to the step of detecting whether the polarization plate enters the positioning platform or not; turning on the conveying mechanism such that the conveying mechanism can transfer the polarization plate; and detecting whether the polarization plate is transferred to a target position on the positioning platform or not, if the polarization plate is transferred to the target position, moving the conveying mechanism downwards until the conveying mechanism is located under the positioning platform, otherwise returning to the step of detecting whether the polarization plate is transferred to the target position or not.

10. A positioning device for a polarization plate disposed adjacent to a transferring roller for receiving the polarization plate transferred from the positioning device and further for roughly positioning the polarization plate, comprising: a positioning platform forming an opening; a conveying mechanism arranged under the positioning platform and corresponding to the opening, the conveying mechanism comprising roller groups and a belt surrounding the roller groups; a first sensor for detecting whether the polarization plate enters the positioning platform or not and outputting a first detecting signal after determining that the polarization plate enters the positioning platform; and a driving mechanism connected to the conveying mechanism and the first sensor, the driving mechanism driving the conveying mechanism to move upwards through the opening to allow the belt to be exposed above the positioning platform after receiving the first detecting signal.

11. The positioning device as claimed in claim 10, wherein the first sensor is fixed to the positioning platform and correspond to the opening formed in the positioning platform.

12. The positioning device as claimed in claim 10 further comprising a second sensor arranged at a position on the positioning platform adjacent to the transferring roller, the second sensor is used for detecting whether the polarization plate is transferred to a target position on the positioning platform or not and outputting a second detecting signal to the driving mechanism after determining that the polarization plate is transferred to the target position, and the driving mechanism drives the conveying mechanism to move downwards to be located under the positioning platform according to the second detecting signal.

13. The positioning device as claimed in claim 12, wherein the roller groups comprise a first roller group adjacent to the transferring roller and a second roller group opposite to the first roller group, and the second sensor is located between the transferring roller and the first roller group.

14. The positioning device as claimed in claim 12 further comprising a positioning assembly arranged on the positioning platform for moving the polarization plate at the target position to a rough-adjusting position.

15. The positioning device as claimed in claim 14, wherein the positioning assembly comprises a first positioning post and a second positioning post, the first positioning post is arranged on one end of the positioning platform away from the transferring roller, and the second positioning post is arranged on one end of the positioning platform adjacent to the transferring roller and is capable of moving towards the first positioning post.

* * * * *